United States Patent [19]

Gongwer

[11] Patent Number: 4,906,870
[45] Date of Patent: Mar. 6, 1990

[54] LOW POWER LOGIC ARRAY DEVICE

[75] Inventor: Geoffrey S. Gongwer, San Jose, Calif.

[73] Assignee: Atmel Corporation, San Jose, Calif.

[21] Appl. No.: 265,830

[22] Filed: Oct. 31, 1988

[51] Int. Cl.[4] ................ H03K 19/096; H03K 19/003; H03K 17/687; H03K 3/013

[52] U.S. Cl. ..................................... 307/465; 307/469; 307/296.3; 364/716; 371/10.1

[58] Field of Search ................ 307/443, 448, 451.452, 307/465, 468, 469, 296.3, 296.1, 296.6; 364/716; 371/10

[56] References Cited

U.S. PATENT DOCUMENTS

| | | | |
|---|---|---|---|
| 3,541,543 | 11/1970 | Crawford et al. | 340/324 |
| 3,566,153 | 2/1971 | Spencer, Jr. | 307/205 |
| 3,702,985 | 11/1972 | Proebsting | 340/166 |
| 3,816,725 | 6/1974 | Greer | 235/152 |
| 3,818,452 | 6/1974 | Greer | 340/166 |
| 3,849,638 | 11/1974 | Greer | 235/152 |
| 4,511,812 | 4/1985 | Satake | 307/465 |
| 4,609,986 | 9/1986 | Hartmann et al. | 364/200 |
| 4,617,479 | 10/1986 | Hartmann et al. | 307/465 |
| 4,697,105 | 9/1987 | Moy | 307/465 |
| 4,713,792 | 12/1987 | Hartmann et al. | 364/900 |
| 4,791,603 | 8/1988 | Jochem | 307/465 X |
| 4,825,098 | 4/1989 | Aoyama | 307/465 X |
| 4,839,539 | 6/1989 | Takata et al. | 307/465 |
| 4,870,302 | 9/1989 | Freeman | 307/465 |

*Primary Examiner*—Stanley D. Miller
*Assistant Examiner*—David R. Bertelson
*Attorney, Agent, or Firm*—Thomas Schneck

[57] ABSTRACT

A logic array device having an input switch detector circuit for each input signal line leading into an array of logic gates and means for enabling the array whenever and only when a change in logic level of at least one input signal is detected. An AND array has a pull-up element connected to the device's power supply, which element is turned on by an AND array enable signal generated by a circuit responsive to switch detection. Likewise, OR gates or NOR gate/invertor combinations have a pull-down or pull-up element which is turned on by an OR array enable signal. The AND array is enabled first, followed by the OR gate or gates. The OR gate or gates is disabled first before the AND gate is disabled. Disablement of the gates when no input level switch is occurring reduces power consumption without affecting device speed, while the order of enablement and disablement prevents glitches or loss of the output signal level during enablement and disablement.

17 Claims, 7 Drawing Sheets

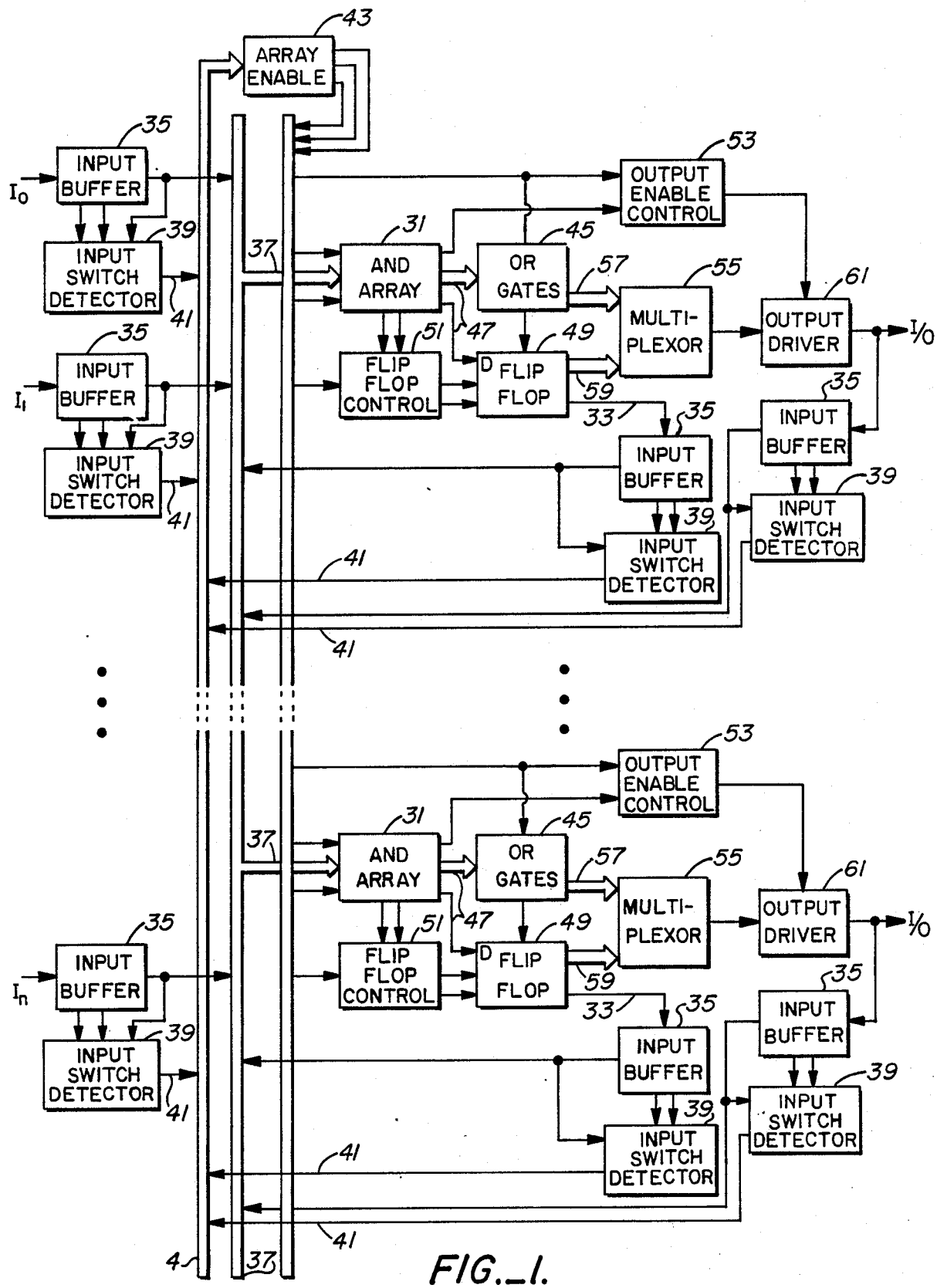
FIG._1.

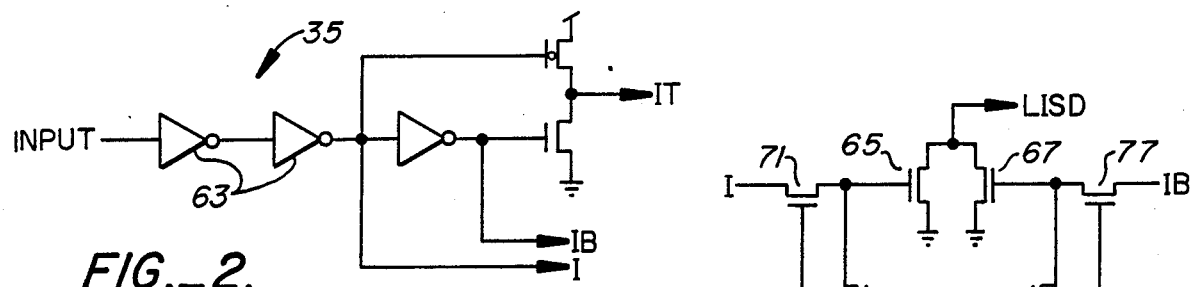
FIG._2.
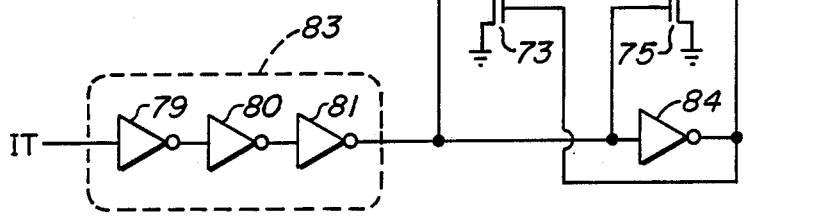
FIG._3.
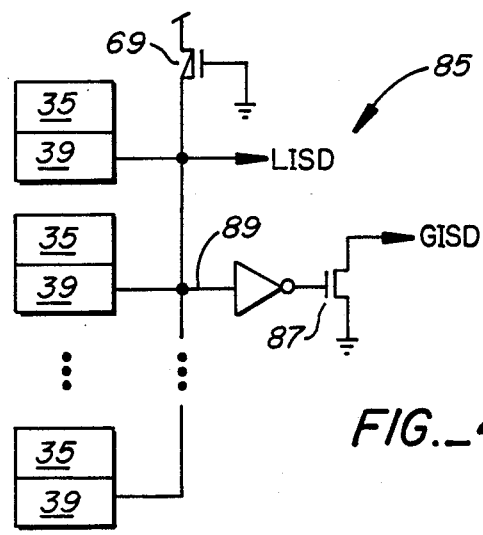
FIG._4.
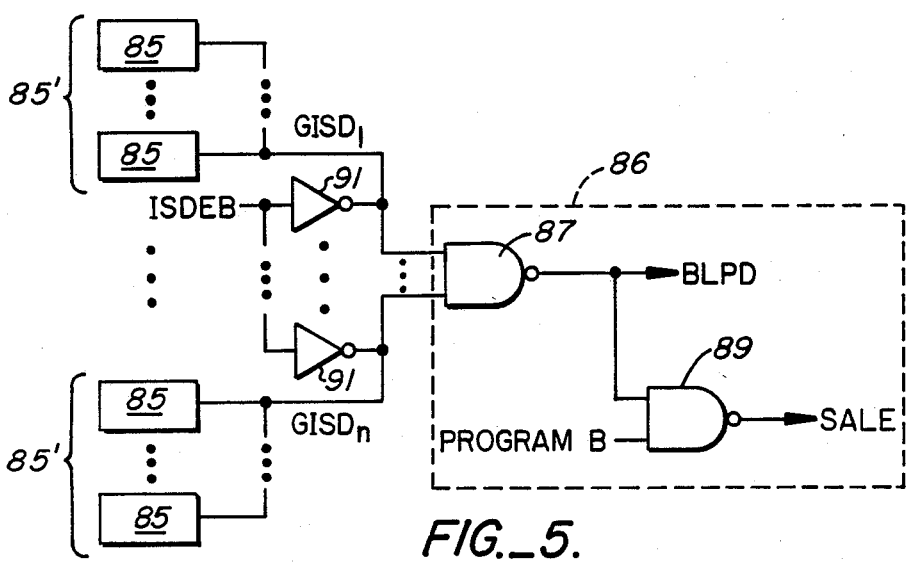
FIG._5.

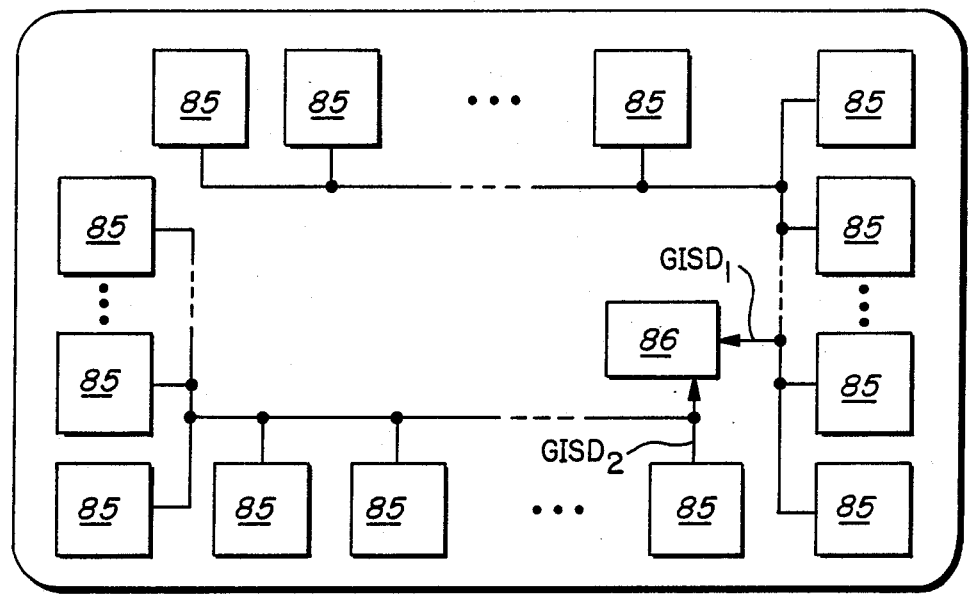
FIG._6.
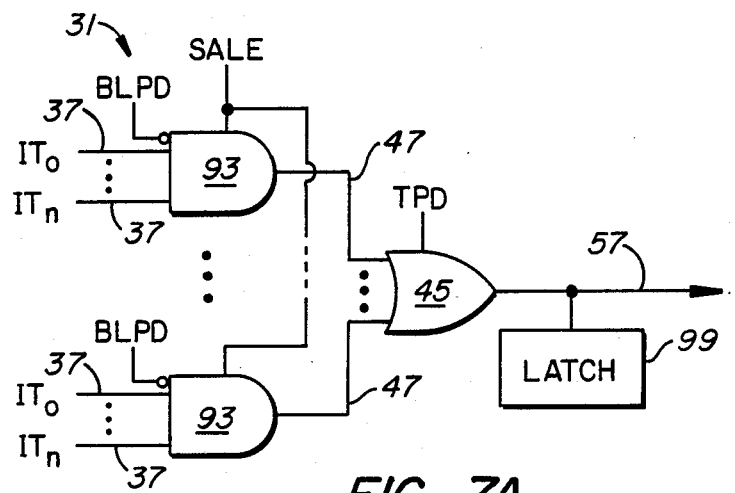
FIG._7A.
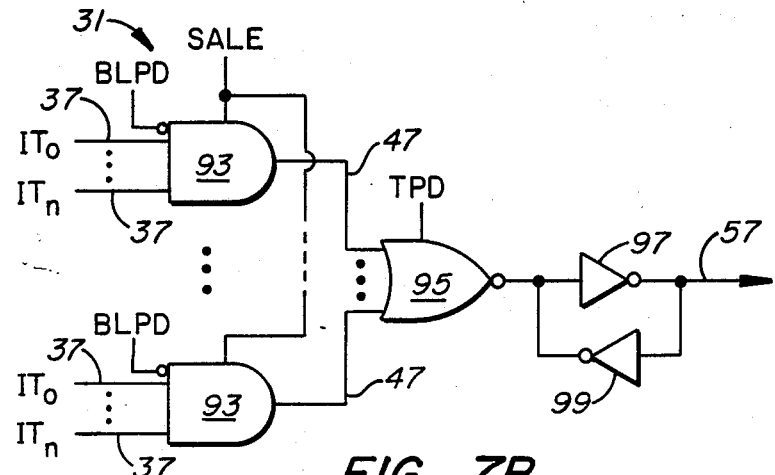
FIG._7B.

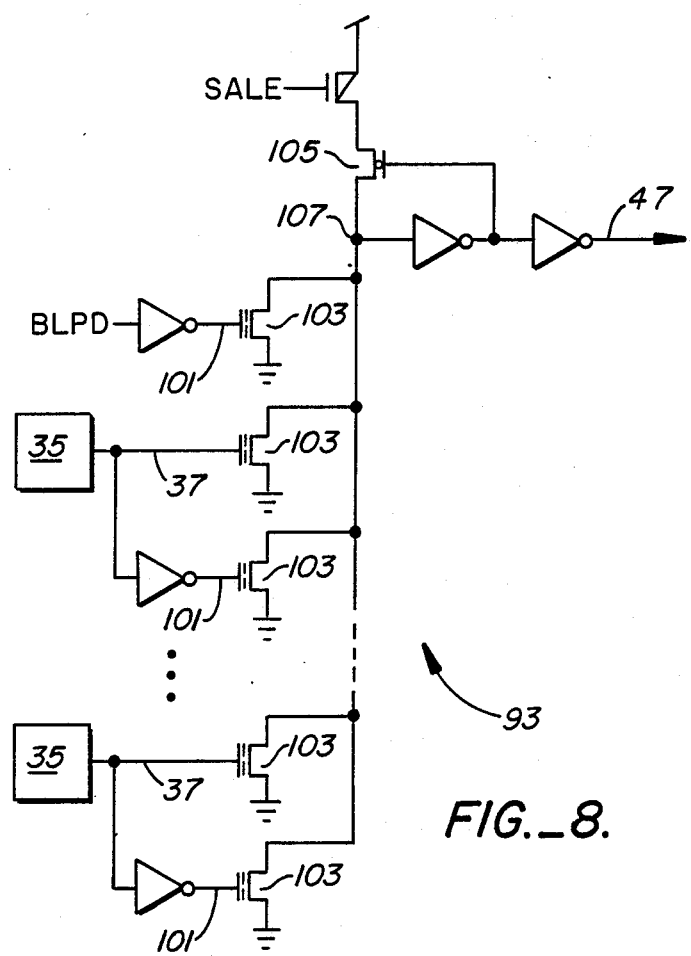
FIG._8.
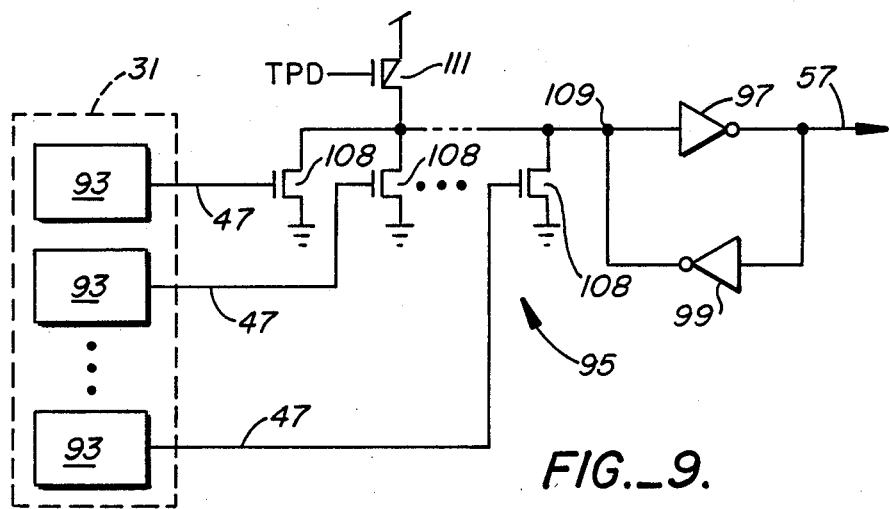
FIG._9.

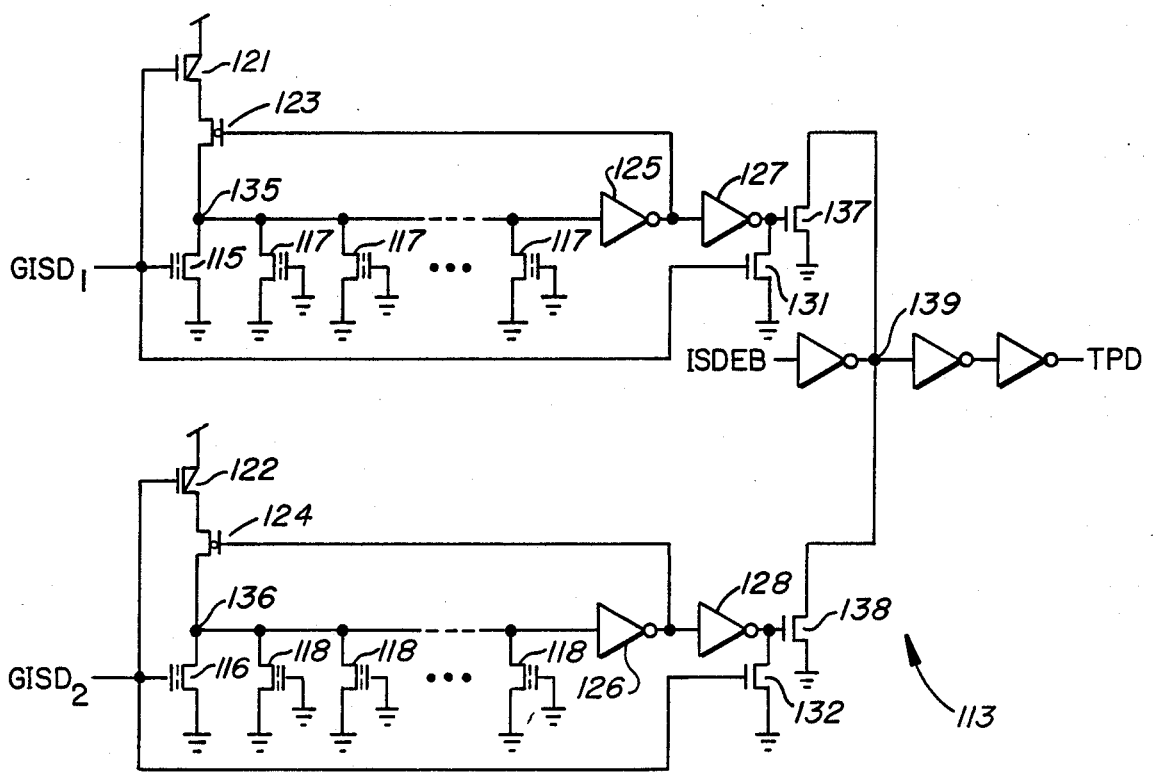
FIG._10.
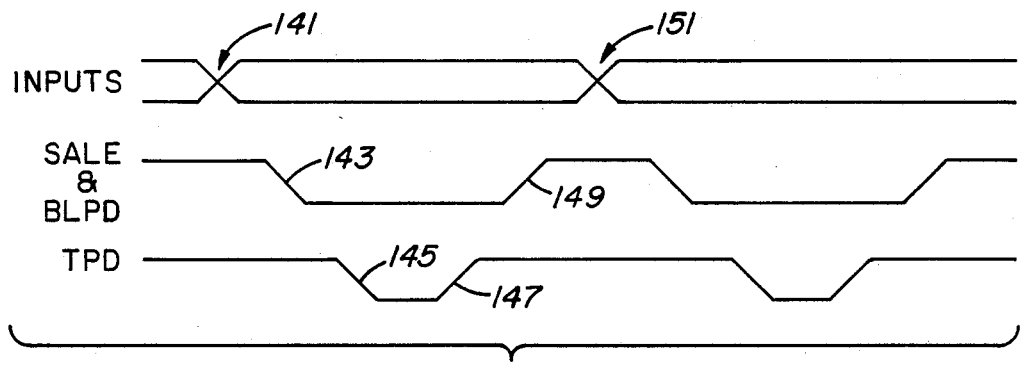
FIG._11.
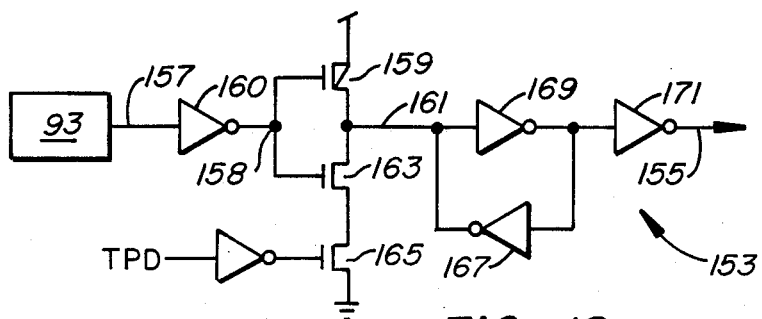
FIG._12.

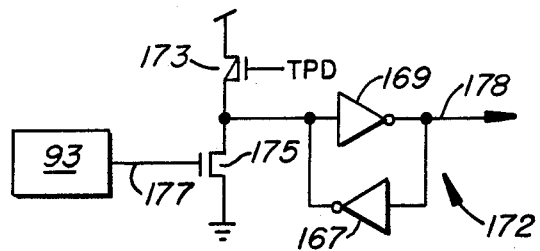
FIG._13.
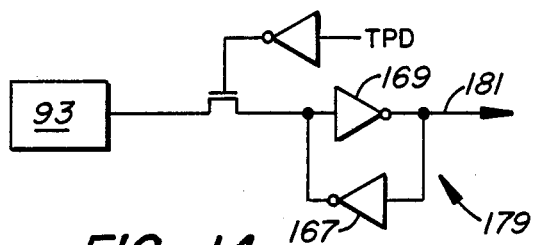
FIG._14.
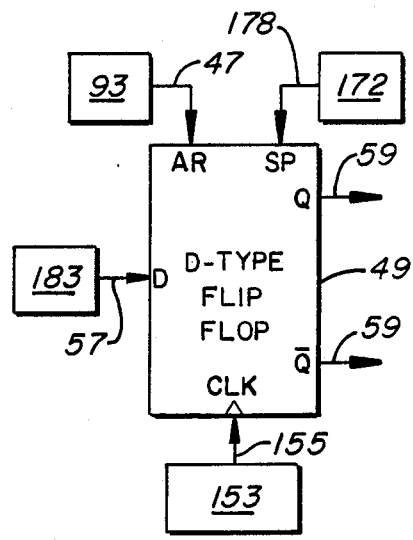
FIG._15.
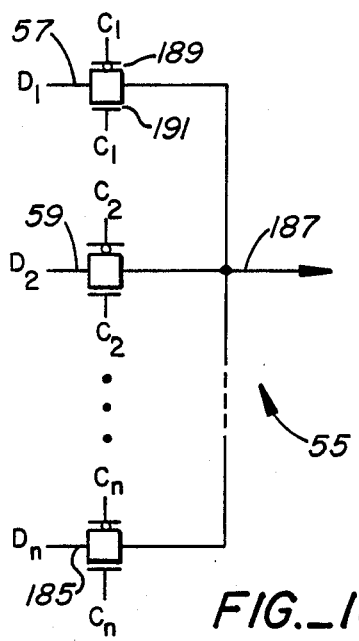
FIG._16.
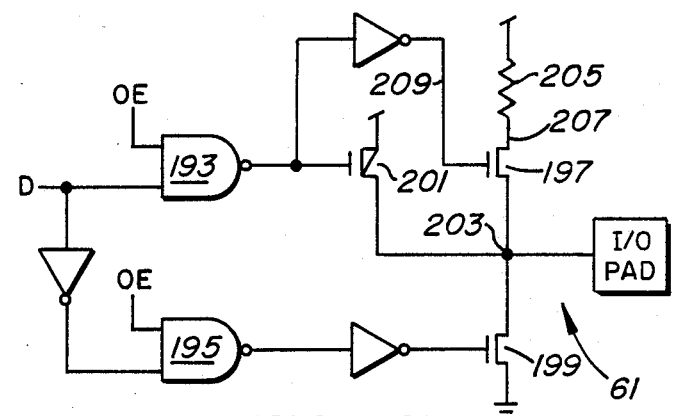
FIG._17.
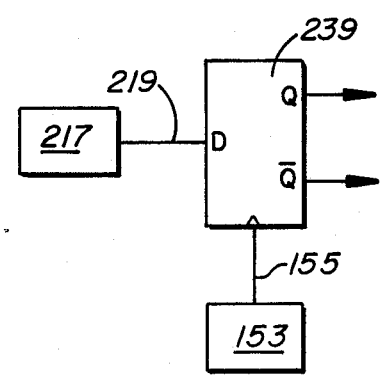
FIG._22.

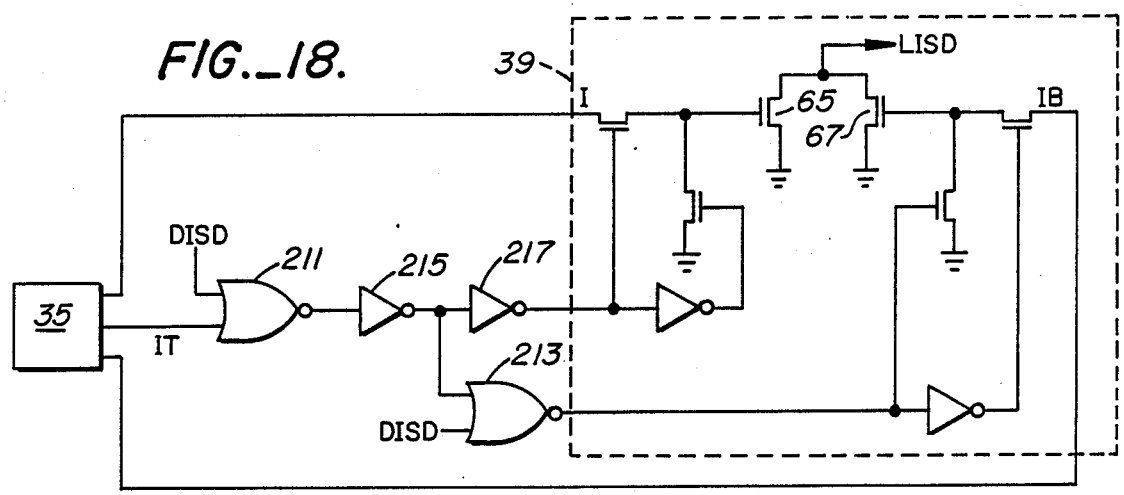
FIG._18.
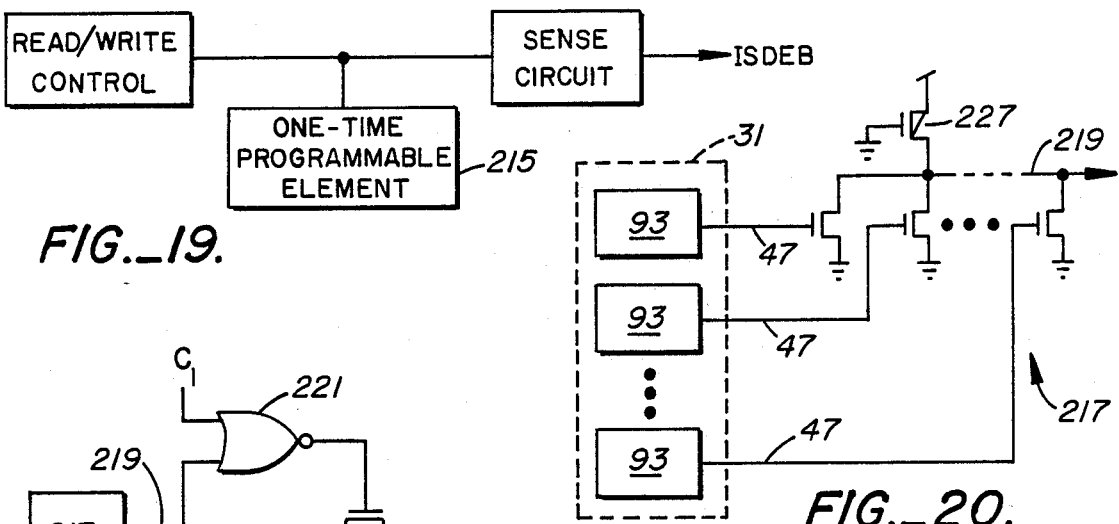
FIG._19.
FIG._20.
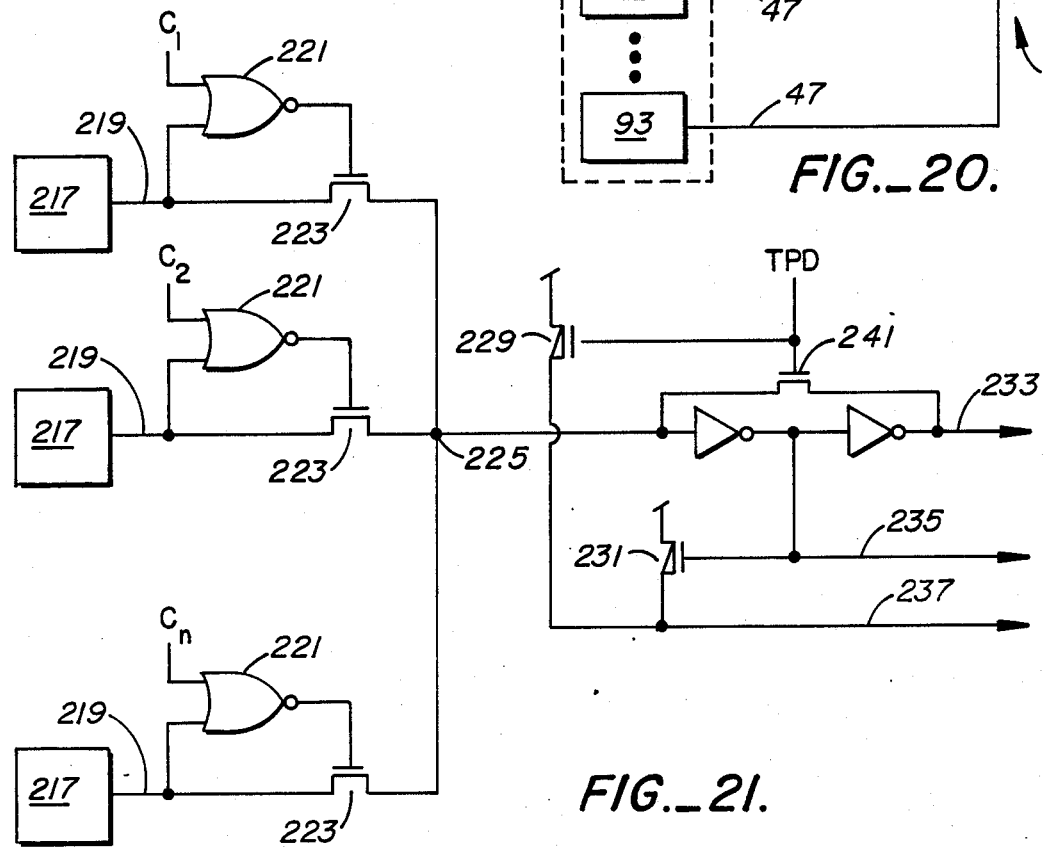
FIG._21.

LOW POWER LOGIC ARRAY DEVICE

TECHNICAL FIELD

The present invention relates to integrated circuits of the class known as programmable logic array devices, and in particular to such logic array devices with circuit elements for reducing power consumption of the devices.

BACKGROUND ART

Various forms of logic array devices have been in use for years. These devices have architectures based on various combinations of gate arrays, such as programmable-AND/programmable-OR, programmable-AND/fixed-OR, NOR/NOR, etc. While these devices have the flexibility to provide a large number of different custom logic functions, their power consumption can be quite high. This is largely because each logic gate within a gate array continually consumes as much as 20 milliWatts of power. The heat generated by the power consumption combined with the limited heat-sinking capability of the devices and their packages creates a practical gate count limit for such logic devices.

Early forms of logic array device used mask-programmable array elements based on bipolar transistor technologies. Later devices were introduced which used fusible links as array elements, allowing the devices to be programmed after manufacturing. Prior U.S. patents describing these early logic array devices include U.S. Pat. Nos. 3,541,543; 3,566,153; 3,702,985; 3,816,725; 3,818,452; and 3,849,638. More recently, programmable logic devices based on CMOS technology have been introduced. Two of these devices are described by Hartmann et al. in U.S. Pat. Nos. 4,609,986 and 4,617,479. These devices use EPROM or EEPROM transistors as the logic array elements. For a given gate count, these CMOS devices operate at lower power levels, because the circuitry surrounding the logic arrays generally does not consume power. For this reason, the introduction of these CMOS-based logic devices has helped to raise the gate count limit. However, the logic gate arrays themselves are still continually drawing current and therefore consuming power.

Another way to increase the permissible gate count for logic array devices is to simply reduce the current drawn by each array gate. However, this approach decreases the speed performance of the device and makes it unsuitable for applications that require high operating speed.

A circuit operation common to many logic array devices is the transmission gating of logic signals from an input terminal to an output terminal. U.S. Pat. No. 4,713,792 to Hartmann et al. describes one implementation of this operation. Available implementations of transmission gating have so far had limitations of either actively consumed power or less than optimum switching speed.

It is an object of the present invention to provide a logic array device with means for reducing the power consumption without substantially affecting the speed performance or logic function of the device.

DISCLOSURE OF THE INVENTION

The above object has been met with a logic array device which includes input switch detection circuitry which detects logic level transitions on inputs to a device's logic arrays. When and only when such a transition occurs are the gates of the logic arrays enabled by an array enable signal generating circuit, because only then will a transition be needed on outputs of the arrays. After such time has passed as is necessary for any such output transitions to occur, the logic array gates are disabled, and their power consumption is essentially eliminated. The logic outputs are stored in a latch while the arrays are disabled. Thus, the total power consumed by the logic device is greatly reduced. Because each gate receives full power when it is enabled, switching speed is not adversely affected.

BRIEF DESCRIPTION OF THE DRAWINGS

FIG. 1 is a block diagram of a reduced power logic array device of the present invention showing its various functional components.

FIG. 2 is a schematic diagram of an input driver circuit in the device of FIG. 1.

FIG. 3 is a schematic diagram of an input switch detector circuit in the device of FIG. 1.

FIG. 4 is a schematic diagram illustrating interconnection of several detector circuits of FIG. 3.

FIG. 5 is a schematic diagram of an AND array enable signal operating circuit in the device of FIG. 1.

FIG. 6 is a block diagram illustrating a physical layout of detector circuits of FIG. 3 or 4 and an enable signal generating circuit of FIG. 5.

FIG. 7A is a schematic diagram of an AND/OR logic array configuration used in the device of FIG. 1.

FIG. 7B is a schematic diagram of an AND/NOR/Inverter logic array configuration equivalent to the configuration in FIG. 7A.

FIG. 8 is a schematic diagram of an AND array gate in FIGS. 7A and 7B.

FIG. 9 is a schematic diagram of a combination NOR/Inverter logic gate in FIG. 7B.

FIG. 10 is a schematic diagram of an OR array enable signal generating circuit in the device of FIG. 1.

FIG. 11 is a timing diagram illustrating the relative switching times of AND and OR array enable signals SALE, BLPD and TPD with respect to input signal switch times.

FIGS. 12-12 are schematic diagrams of alternative circuits for generating and holding AND array gate outputs used for generating control signals in the device of FIG. 1.

FIG. 15 is a block diagram illustrating interconnections to a flip-flop storage element in the device of FIG. 1.

FIG. 16 is a schematic diagram of a low power, high speed, N:1 multiplexer in the device of FIG. 1.

FIG. 17 is a schematic diagram of an output driver in the device of FIG. 1.

FIG. 18 is a schematic diagram of an alternative embodiment of the input switch detector circuit in FIG. 3.

FIG. 19 is a block diagram of a control signal generating circuit using a one-time programmable element.

FIG. 20 is a schematic diagram of a NOR array gate for use in circuit in FIG. 21.

FIG. 21 is a schematic diagram of an alternative array gate with switch connectable elements.

FIG. 22 is a block diagram of an alternative embodiment of the flip-flop configuration of FIG. 15.

BEST MODE FOR CARRYING OUT THE INVENTION

With reference to FIG. 1, a reduced power logic array device of the present invention has one or more arrays 31 of logic gates. Typically, the logic gates are AND gates, although NAND or NOR gates may also be used, and arrays 31 will be referred to hereafter as AND arrays 31. Input pins $I_0, I_1, \ldots, I_n$, input/output pins I/O and flip-flop outputs 33 all drive input buffers 35. Each input buffer 35 drives inputs 37 to an AND array 31. Each input buffer 35 also drives an input switch detector 39. The outputs 41 of the switch detectors 39 combine in an array enable signal generator 43 to generate signals that enable and disable the AND arrays 31 and OR gates 45. Each AND array 31 produces outputs on product term lines 47 which drive inputs to OR gates 45, flip-flops 49, flip-flop control signal generators 51 and output enable control signal generators 53. Multiplexers 55 receive as inputs both a combinatorial output from OR gates 45 along sum term lines 57 and a register output from flip-flops 49 along lines 59, and selectively pass one of these outputs to output drivers 61. Output drivers 61, when they are enabled by signals from output enable control signal generators 53, drive input/output pin I/O.

With reference to FIG. 2, a circuit implementation of input buffers 35 receives a signal INPUT from an input pin, an input/output pin or a flip-flop output. Signal INPUT goes through level shifting and gain inverters 63, producing a signal IT which is an input to an AND array. Signal outputs I and IB produced by input buffer 35 are used in the input switch detector 39 in FIG. 3. Signal IB is inverted compared to signals I and IT.

With reference to FIG. 3, an input switch detector 39 comprises a pair of pull-down transistors 65 and 67 whose gates are connected to respective pass transistors 71 and 77. Pass transistors 71 and 77, when on, transmit signals I and IB to the gates of pull-down transistors 65 and 67. The gates of pull-down transistors 65 and 67 are also connected to respective turn-off transistors 73 and 75. The gates of pass transistors 71 and 77, and of turn-off transistors 73 and 75 are toggled by a signal from a delay circuit 83. Transistors 71 and 75 are directly connected, while transistors 73 and 77 are connected indirectly through an inverter 84. Delay circuits 83 comprises an odd number of inverters 79–81 which invert and slow down the propagation of signal IT from input buffer 35.

In operation, pull-down transistors 65 and 67 are normally off, and signal LISD is held high by a pull-up transistor 69, seen in FIG. 4. If the input signal IT to the AND array is high, transistor 71 is off and turn-off transistor 73 is on, keeping transistor 65 off. Also, transistor 75 is off, pass transistor 77 is on, transmitting signal IB, which is low whenever signal IT is high, and thereby keeping transistor 67 off. Whenever the input IT switches from high to low, signal IB goes high, thereby turning on transistor 67 which pulls down signal LISD. After some time interval determined by the delay elements 79–81 in delay circuit 83, turn-off transistor 75 comes on and pass transistor 77 turns off, thereby causing pull-down transistor 67 to turn off and allowing signal LISD to return high. Pull-down transistor 65 remains off, since turn-off transistor 73 is now off and pass transistor 77 is now on, transmitting signal I which is low. Likewise, if the input IT switches from low to high, signal I goes high and transistor 65, now on, pulls down signal LISD. Again after a delay period, pass transistor 71 turns off and turn off transistor 73 comes on, thereby turning off transistor 65 and allowing signal LISD to return high. Therefore, the local input switch detection signal LISD pulses low whenever the input signal IT to the AND array switches, either from low to high or high to low.

As seen in FIG. 4, several input switch detection circuits 39 may be grouped together with a single pull-up transistor 69 for holding signal LISD high. Signal LISD will pulse low whenever an array input transition has occurred in any one of associated input buffers 35. Global input switch detection signal GISD, produced by a pull-down transistor 87 connected to the LISD signal line 89 via an inverter 91, will likewise pulse low. Any number of input buffers 35 and switch detectors 39 may be grouped together in the configuration 85 of FIG. 4. However, a practical limit is set by capacitive loading created on signal LISD. Any number of groupings of switch detector circuits shown in FIG. 4 may in turn be grouped together in a hierarchical manner to create an individual GISD signal, but the attendant capacitance again creates a practical limit. FIG. 5, for example, shows the groupings 85 in FIG. 4, each outputting a global detection signal GISD, being combined into larger groupings 85' to produce signals $GISD_1, \ldots, GISD_n$.

With reference to FIG. 5, an AND array enable signal generator circuit 86 includes a NAND gate 87 with inputs from several input switch detection circuits 39 in FIG. 3, 85 in FIG. 4, or hierarchic combinations 85' of circuits 85 in FIG. 4. Normally, the signals $GISD_1, \ldots, GISD_n$ on these inputs are all high, and bit-line pull down signal BLPD on the output to NAND gate 87 is low. The circuit in FIG. 5 also has a second NAND gate 89 with an input connected to the output of NAND gate 87. A second input PROGRAMB is normally high, except when the AND array is being programmed. The output SALE from second NAND gate 89 is normally high.

When an input switch is detected, at least one of the input switch detection signals $GISD_1, \ldots, GISD_n$ pulses low. As a result, signal BLPD pulses high and signal SALE pulses low. As will be discussed later, this enables the AND gates in the array.

A signal ISDEB may be used to enable or disable the power reduction circuitry 86. Normally, signal ISDEB is low, and the inverted signal generated by inverters 91 and input into NAND gate 87 is high. In this case, the pull up elements in inverters 91 serve to hold signals $GISD_1 \ldots GISD_n$ normally high. When ISDEB is high, signal BLPD is always high, SALE is always low and the AND array is always enabled, whether or not an input switch detection is indicated. In other words, the switch detection circuits 85 are disabled when signal ISDEB is high. FIG. 6, shows one possible arrangement of two groups of input switch detection circuits 85 input into an array enable signal generating circuit 86 in a logic array device of the present invention.

With reference to FIG. 7A, an AND/OR logic array configuration includes an array 31 of AND gates 93, a group of which is shown, and one or more OR gates 45. Input signals $IT_0, \ldots, IT_n$ on input lines 37 from input buffers 35 in FIG. 2 drive AND gates 93. Signal BLPD produced by the AND array enable signal generator circuit 86 in FIG. 5 is also used as an input to AND gates 93. Signal SALE, when high, turns off AND gate 93's pull-up element, thereby eliminating any power consumption by the AND gate. The product term lines 47 output by AND gates 93 drive one or more OR gates 45. A signal TPD, produced by a circuit in FIG. 10 described below, enables the OR gates 45. Like the signal SALE, signal TPD pulses low when an input transition occurs. When TPD is high, the pull-down elements in the logic array's OR gates 45 are turn off, eliminating any power consumption by the OR gates. In FIG. 7B, an equivalent AND/NOR/INVERT logic array configuration has identical elements except that a NOR gate 95 and an inverter 97 replaces OR gate 45 in FIG. 7A. In this case, signal TPD enables a pull-up element in NOR gate 95.

In either case, when an input switch is detected, signal BLPD goes high and signal SALE goes low enabling AND gates 93. Signal TPD goes low, enabling the OR gates 45 or alternatively NOR gates 95. After some propagation delay time, the new logic array data will appear on the output 57 of OR gates 45 or of the NOR gate 95 combined with inverter 97. After an internally timed delay period, signal SALE will go high and signal BLPD will go low. This will shut off any AND gate power consumption and drive the AND gates' output 47 low. Likewise, signal TPD will go high, disabling OR gate 45's output pull-down element (or NOR gate 95's pull-up element). In this manner, OR gate 45 or NOR gate 95 is effectively turned off and the output signal 57 is held by a latch 99.

With reference to FIG. 8, an AND gate 93 is driven by outputs 37 from input buffers 35. The outputs 37 and their complements 101 control the gates of EPROM transistors 103. The drains of the transistors 103 are connected together and to a source of a sensing transistor 105 at a node 107. When the AND logic array including gate 93 is enabled, by signal SALE being low, the sensing node 107 will be high only if the gate electrodes 37 and 101 of all the unprogrammed EPROM transistors are low, and if signal BPLD is high. If the gate electrode of any unprogrammed EPROM transistor is high, that EPROM will conduct, and nodes 107 and output 47 will be low. Programmed EPROM transistors have a higher threshold, and therefore do not conduct.

With reference to FIG. 9, a NOR gate 95 is driven by the outputs 47 of gates 93 in AND array 31. A high output 47 on any AND gate 93 will turn on one of the transistors 108 and will pull node 109 low and make inverter 97's output 57 high. Conversely, if no AND outputs 47 are high while the NOR gate 95 is enabled, i.e. while signal TPD is low, transistor 111 will pull node 109 high and the inverter output 57 will go low.

One factor crucial to the correct operation of the gate power-up and power-down cycles is the relative timing of the OR enable signal TPD to that of the AND enable signals SALE and BLPD. When an input switch has occurred, the OR gates must not be enabled until the AND array gates have been enabled long enough to produce any high outputs. Otherwise, the OR gate enable element will cause an undesired low "glitch" on the output. For example, in FIG. 9, if any of the AND gate outputs 47 have a high output the signal at node 109 will be pulled-down and the output 57 should be high. However, if signal TPD enables the NOR gate 95 too soon, the pull-up transistor 111 will pull-up the signal node 109 until one of the AND gate outputs 47 turns high. Thus, an undesired low pulse will appear at the output 57. Conversely, the OR gates must disable before the AND gates disable to prevent the OR gates' enabling elements 111 from switching their outputs 57 low after the AND gates' outputs 47 have gone low.

With reference to FIG. 10, an OR gate enable signal generator circuit 113 meets these timing requirements. OR gate enable signal generator 113 is driven by input switch detection signals $GISD_1$ and $GISD_2$ from detection circuits 85 in FIG. 4 just like the AND array enable signal generator 86 in FIGS. 5 and 6. However, EPROM transistors 115–118 together with elements 121–128 guarantee that signal TPD will not go low until a delay period has occurred to first allow the AND array to be enabled. The gates of EPROM transistors 115 and 116 are controlled by respective signals $GISD_1$ and $GISD_2$. The drains of transistors 115 and 117 are connected together and to a source of a sensing transistor 123 at a node 135. Likewise, the drains of transistors 116 and 118 are connected together and to source of sensing transistor 124 at a node 136. Signals $GISD_1$ and $GISD_2$ are normally high, EPROMs 115 and 116 normally conduct and nodes 135 and 136 are normally low. Transistors 121 and 122 are off, transistors 137 and 138 are off, node 139 is high and signal TPD is high. When either or both of signals $GISD_1$ or $GISD_2$ pulse low, the corresponding EPROM transistor 115 or 116 or both turns off. Transistor 121 or 122 or both turns on, but the gate capacitance of additional EPROM transistors 117 and 118 causes a delay in node 135 or 136 or both going high so that the output of inverter 125 or 126 does not immediately switch from high to low. Eventually, the output of inverter 125 or 126 or both does switch from high to low. Either or both of transistors 137 and 138 turns on and node 139 goes low. Accordingly, signal TPD also goes low.

The presence of bypass transistors 131 and 132 insures that signal TPD returns high and disables the OR gate before the AND array disables. As soon as signals $GISD_1$ and $GISD_2$ return high, bypass transistors 131 and 132 turn on, immediately shutting off transistors 137 and 138. Nodes 139 and signal TPD return high. Though it takes time for the nodes 135 and 136 to fully return to low due to the capacitance of EPROMs 117 and 118, this delay has no effect on signal TPD, due to bypass transistors 131 and 132.

Returning to FIG. 9, note that as the logic arrays enable, a high output 47 from AND gates 93 is able to switch the OR gate 57 high without having to wait for the NOR gate 95 to be enabled by signal TPD. This minimizes signal propagation time through the logic arrays when an AND output is going high. Therefore, the propagation delay time required for producing a high OR gate output is limited only by the enabling of the AND gate and is not restricted by the AND/OR array enable timing sequence constraints described above.

In FIG. 11, a waveform timing diagram shows input signals switching at a time 141, either from high to low or low to high. This switch is detected by detectors 39 in FIGS. 3 and 4 and enable signals SALE, BLPD and TPD are generated by circuits 86 and 113 in FIGS. 5 and 10. AND array enable signals SALE and BLPD pulse low at a time 143 shortly after the switch. At some time 145 later, after the AND arrays have enabled, signal TPD goes low, enabling the OR gates. As soon as the OR gate output 57 in either FIG. 7A or 7B is stored in latch 99, the signal TPD goes high at time 147, disabling the OR gates. Finally, AND array enable signals SALE and BLPD go high at time 149, disabling the AND arrays. At another time 151, another input signal switch occurs and the power up/power down cycle repeats.

With reference to FIG. 12, a circuit 153 for generating and holding a logic array output signal 155 from a single AND gate output 157 is shown. If the output 157 of AND gate 93 goes high when the gate is enabled, node 158 on the ouptut of inverter 160 will go low, and thus, pull-up transistor 159 will pull node 161 high and the logic output node 155 will go high. If the AND gate's output 157 remains low when the gate is enabled, then when signal TPD also goes low, transistors 163 and 165 will pull node 161 low and the output signal 155 will go low. When the enable cycle is complete, signal TPD will go high, turning off transistor 165. Then when the AND gate 93 is disabled, AND output 157 will go (or remain) low and pull-up transistor 159 will turn (or stay) off. The logic output 155 remains in its high or low state, held valid by latch inverter 167. Inverters 160, 169 and 171 provide any propagation delay that is need. One feature of circuit 153 is that the only power consumed by the circuit is in the AND gate 93. No other portion of the circuit ever creates an active current path from the power supply to ground. Another feature of the circuit is that like the OR gate output 57 in FIG. 9, the output 155 can switch high without having to wait for signal TPD to go low.

In FIGS. 13 and 14, other embodiments of the circuit 153 in FIG. 12 perform the same function but have faster signal switching. However, the circuit 172 in FIG. 13 has the disadvantage of consuming power in transistors 173 and 175 when the AND gate output 177 is high. The circuit 179 in FIG. 14 has both fast signal switching and low power consumption but its output 181 cannot switch in either direction until signal TPD goes low. All provide latching of output 155 with inverters 167 and 169.

With reference to FIG. 15, a flip-flop register 49 is typically a D-type flip-flop of the prior art. The output 57 from an OR gate 183 or equivalent NOR gate-inverter combination in accord with FIG. 9 drives a data input D and outputs 59 are produced. Control signal inputs AR, SP and CLK are driven by AND array programmable signals. The logic circuit 153 of FIG. 12, for example, may be used to generate a clock signal 155. Because of the structure of this circuit, the rising edge of the clock signal is not dependent upon the timing of the TPD signal, as explained above. This feature maximizes the operating speed of the logic array device when registered logic is used. The circuit 172 of FIG. 13 may be used to generate the flip-flop's synchronous preset control signal 178. Because there need be only a few preset signals in a logic array device, the additional power consumed by the circuit 172 of FIG. 13 is less of a disadvantage than the benefit gained from the circuit's increased operating speed. The flip-flop's asynchronous reset signal 47 is driven directly by the output of an AND gate 93. No latching element is needed because of the asynchronous nature of the reset signal.

With reference to FIG. 16, an N:1 multiplexer 55 is provided for the logic array device which has maximized switching speed and low power operation. The multiplexer inputs $D_1, D_2, \ldots, D_n$ are driven by outputs 57 from one or more OR gates, outputs 59 from one or more flip-flops 49, and one or more other signals 185. The multiplexer outputs an output signal 187 selected from one of the inputs $D_1, D_2, \ldots, D_n$ depending on which of the control signals $C_1, C_2, \ldots, C_n$ is high.

Each input signal drives the source of two parallel N-channel transistors 189 and 191. The larger transistor 191 is an enhancement type device with a threshold of 0.6 to 0.8 volts. This transistor provides the high speed signal transmission. The other transistor 189 has a threshold of 0.1 to 0.2 volts, and serves to pull the output node 187 up to a voltage level near that of the selected input signal.

Two methods are available for adjusting the threshold of transistors 189. One, a threshold-shifting implant may be formed during the device's manufacturing process. Alternatively, the threshold may be varied by choosing its channel length and width appropriately according to well-known techniques.

With reference to FIG. 17, an output driver 61 receives an enable signal OE generated by any of the logic generation circuits described above with reference to FIGS. 12–14 or form an input buffer, such as the one in FIG. 2, and also receives a data signal D to be output from either a logic OR gate, such as the one in FIG. 9, a flip-flop, such as the one in FIG. 15, or a multiplexer, such as the one in FIG. 16. Enable signal OE and data signal D drive inputs to NAND gates 193 and 195, where the data signal into NAND gate 195 is first inverted. The inverted outputs of NAND gates 193 and 195 drive gates of respective N-channel transistors 197 and 199. The output of NAND gate 193 also drives the gate of a P-channel transistor 201. The source of transistor 197, and the drains of transistors 199 and 201 are connected to each other and to an I/O pad at a node 203. The drain 207 of transistor 197 is connected via a resistor 205 to the device power supply. The source of transistor 199 is grounded, and the source of transistor 201 is connected to the device power supply.

When enable signal OE is low, then the NAND gates 193 and 195 output high regardless of the value of data signal D, and all transistors 197, 199 and 201 are off, and the driver is disabled. The output driver 61 is enabled when signal OE is high. When data signal D is low, transistors 197 and 201 are off and transistor 199 is on, pulling the output node 203 low. When data signal D is high, transistor 199 is turned off and transistors 199 and 201 are on. P-channel transistor 201 pulls the output node 203 up to the full voltage level of the device power supply. This reduces the power consumption in a system where the I/O pad is connected to inputs of other CMOS devices. N-channel transistor 199 pulls up the output node 203 more quickly than would be possible with P-channel transistor 201 alone, thereby maximizing the operating speed of the device.

Resistor 205 limits the current through transistor 197 if output node 203 is at ground potential while node 209 is high. By putting the resistor 205 on drain 207 of transistor 197, the resistor has minimal effect on the operating speed of the device.

With reference to FIG. 18, the input switch detector 39 of FIG. 3 may be enhanced to further reduce the power consumption of a logic array device. The portion seen in FIG. 18 which is enclosed in dashed lines 39 is the same as the circuit in FIG. 3 except that delay elements 83 are replaced, outside the dashed line 39, by NOR gates 211 and 213 and inverters 215 and 217. When disable signal DISD is low, NOR gates 211 and 213 act as inverters. When disable signal DISD is high, transistors 65 and 67 will always be off and so detection signal LISD will not be pulled low even if the associated input signal IT switches. This is useful in situations where a particular device input or other logic array is not being used by the particular logic function programmed into the device.

With reference to FIG. 19, a one-time programmable MOS element 215 may be used to produce control signals, such as the input switch detector enable signal ISDEB in FIG. 5. One such configuration is disclosed in U.S. Pat. No. 4,713,792 to Hartmann et al. Typically, the programmable element 215 is a non-erasable floating gate MOS structure. By selectively programming these elements in a logic array device, a manufacturer can irreversibly alter the device to generate certain enabling control signals, so as to divide the device circuit components, emulate several different types of devices in a single device or replace circuitry within the device with a backup.

With reference to FIGS. 20 and 21, NOR logic gates 217 may be selectively grouped together into a single NOR gate. Selection control signals $C_1, C_2, \ldots, C_n$ may be generated from either non-volatile programmable elements or from volatile storage elements. These control signals $C_1, \ldots, C_n$, together with gate outputs 219 are input into NOR gates 221, the outputs of which connect to the gates of pass transistors 223. When a control signal $C_1, \ldots, C_n$ is low, the individual NOR output 219 corresponding to that control signal is selectively passed through the corresponding pass transistor 223 to node 225. When that control signal is low, the corresponding NOR output 219 is disconnected from node 225.

When a device's logic arrays 31 are in a disabled state, outputs 47 of the AND gates 93 are low. The gate of NOR gate 217's pull-up transistor 227 is at ground potential, so during this disablement period, the NOR gate output 219 will be held high by transistor 227. When an input level switch is detected, the AND array 31 is enabled. Any AND gate 93 with a high output 47 will pull down the NOR output 219. This, in turn, will turn on that NOR gate's transmission transistor 223 in FIG. 21 if the corresponding control signal $C_1, C_2, \ldots, C_n$ is low, and node 225 will also be pulled low. If no AND gate output 47 in any of the connected NOR gates 217 is high, all transmission transistors 223 will be off and as the enable signal TPD goes low, node 225 will be pulled high by transistors 229. When the logic arrays subsequently disable, signal TPD goes high, turning off transistor 229. Transistors 231 and 241 hold node 225 in its latest high or low state. If any AND gate outputs 47 in FIG. 20 were high, they will go low, turning off all pass transistors 223 and eliminating any active power consumption in this AND/NOR configuration. Output signal nodes 233, 235 and 237 are available at all times to drive inputs of flip-flops 49 or multiplexers 55 shown in FIGS. 15 and 16.

With reference to FIG. 22, the AND/NOR circuit 217 of FIG. 20 may also be used to provide a data input signal D to a flip-flop storage element 239. When the logic arrays in FIG. 20 are in a disabled state, the output 219 is high, as explained above. Since the clock input 155 to the flip-flop is coming from the output of a logic gate 155 as in FIG. 12, the logic arrays will necessarily be enabled at times when the clock signal is switching. At such times, the logic output 219 goes low if any output of an AND gate in that array goes high. After a time delay period determined by inverter elements 160, 169 and 171 in FIG. 12, the clock signal 155 will go high, storing the desired data in flip-flop 239.

I claim:

1. A logic array device comprising,
   at least one array of logic gates, each array producing at least one output signal corresponding to logic states of said gates,
   means for detecting changes in logic levels of inputs to said gates, said detecting means generating at least one detection signal in response to a change in said logic level of at least one input to said gates,
   means receiving said detection signal for enabling said logic gates for a time period after said changes are detected, said logic gates of said array being in a disabled, reduced power consuming state outside of said time period, and
   means for temporarily storing at least one output signal from each array while said logic gates of said array are disabled.

2. The logic array device of claim 1 wherein said detecting means comprises at least one detection circuit associated with an input signal and outputting a local detection signal in response to a change in said associated input signal.

3. The logic array device of claim 2 further comprising means connected to said at least one detection circuit for permanently disabling said detection circuit.

4. The logic device of claim 2 wherein said detection circuit comprises
   a first pair of transistors having drains connected together and to a pull-up transistor at an output node, having sources connected to ground, and having gates,
   a second pair of transistors having drains connected to gates of respective transistors of said first pair, having sources connected to receive respectively an input signal and an inverted input signal, and having gates connected to a delay element to receive respectively a delayed inverted input signal and a delayed input signal, and
   a third pair of transistors having drains connected to gates of respective transistors of said first pair, having sources connected to ground, and having gates connected to said delay element to receive respectively a delayed input signal and a delayed inverted input signal, whereby said detection signal is produced at said output node, said detection signal pulsing low whenever said input signal switches from one state to another state.

5. The logic array of claim 4 wherein said delay element comprises an odd number of inverters.

6. The logic array of claim 4 wherein said delay element comprises,
   means having an input and an output connected to said second and third pairs of transistors for delaying propagation of an input signal from said input to said transistors, and
   means connected to said delaying means and receiving a switch detector disable signal for disabling said detection circuit in response to disable signal.

7. The logic array of claim 6 wherein said delay element comprises
   a first NOR gate having an input receiving an input signal, a second input receiving a switch detector disable signal, and having an output,
   a plurality of inverters connected in series to said first NOR output, an output from a last inverter in the series connecting to a first group of transistors of said second and third pairs of transistors, and
   a second NOR gate having an input receiving an output from a first one of said inverters, having a second input receiving said switch detector disable signal, and having an output connected to a second group of transistors of said second and third pairs of transistors.

8. The logic array device of claim 2 wherein outputs from a plurality of detection circuits are grouped together so as to produce a single global detection signal.

9. The logic array device of claim 1 wherein said enabling means comprises,
   means responsive to said at least one detection signal for generating at least one AND array enable signal at a first time for a first time period, and
   means responsive to said detection signal for generating at least one OR array enable signal at a second time for a second time period, said second time later than said first time but within said first time period, said second time period shorter in length than said first time period such that said OR array enable signal turns on after and turns off before said AND array enable signal,
   wherein said at least one array of logic gates includes an array of AND gates having a pull-up element connected to a power supply, and includes at least one NOR gate receiving AND gate outputs and having a pull-up element connected to said power supply, said pull-up elements of said AND and NOR gates being activated by respective AND and OR array enable signals.

10. The logic array device of claim 9 wherein said means for generating at least one AND array enable signal comprises,
    a first NAND gate having inputs communicating with said detecting means for receiving said at least one detection signal having additional inputs receiving switch detector enable control signals, and having an output generating a first enable signal, said output being an input to each AND gate of said array of AND gates,
    a second NAND gate having an input connected to said first NAND gate output and having a second input receiving a program condition control signal, said second NAND gate having an output generating a second enable signal, said second NAND gate output connected to a gate of a pull-up element of said array of AND gates.

11. The logic array device of claim 9 wherein said means for generating at least one OR array enable signal comprises,
    an EPROM transistor having a control gate communicating with said detecting means for receiving said detection signal, having a source at ground, and having a drain connected to a first node,
    means connected in parallel to said first node for providing a signal-propagation-delaying capacitance,
    a first inverter having an input connected to said first node and having an output,
    a sensing transistor having a source connected to said first node, a gate connected to said first inverter output, and a drain,
    a pull-up transistor connected to the drain of said sensing transistor and having a gate toggled by said detection signal,
    a second inverter having an input connected to said first inverter output and having an output,
    an enable signal generating transistor having a gate connected to said second inverter output, having a source at ground, and having a drain producing said OR array enable signal generator, and a bypass turn-off transistor having a gate communicating with said detector means for receiving said detection signal, having a source at ground and having a drain connected to said enable signal generating transistor's gate.

12. The logic array device of claim 1 further comprising means communicating with said at least one array of logic gates for selecting one or more of said output signals to be transmitted to one or more output pins.

13. The logic array device of claim 13 wherein said selecting means comprises
    a plurality of pairs of transistors, each pair having an input receiving an output signal from said array or from a signal storage element, only one of said pairs transmitting said output signal at its input to an output, wherein each pair of transistors includes a first high speed transistor with a threshold in a range from 0.6 to 0.8 volts and a second pull-up transistor with a threshold in a range from 0.1 to 0.2 volts, each transistor having a gate receiving a selection control signal.

14. The logic array device of claim 1 further comprising means communicating with said temporary storing means for driving an output pin with said output signal.

15. The logic array of claim 1 further comprising an output driver having
    a pair of NAND gates, each of said NAND gates having first inputs receiving an enable signal, a first one of said pair of NAND gates having a second input connected to receive a data signal corresponding to said array output signal, a second one of said pair of NAND gates connected to receive an inverted data signal, each of said NAND gates having outputs,
    means connected to said first and second NAND gate outputs for inverting signals on said NAND gate outputs,
    a pair of N-channel transistors, a first one of said pair of N-channel transistors having a gate connected to said inverting means so as to receive said inverted output signal from said first NAND gate, said first N-channel transistor also having a drain connected through means for providing a resistance to a power supply and having a source connected to an output node, a second one of said pair of N-channel transistors having a gate connected to said inverting means so as to receive said inverted output signal from said second NAND gate, said second N-channel transistor also having a drain connected to said output node and having a grounded source, and
    a P-channel transistor having a gate connected to said output of said first NAND gate, having a drain connected to said output node, and having a source connected to said power supply.

16. In a logic array device of the type having at least one array of AND gates, at least one OR gate having a plurality of inputs connected to outputs of said AND gates, at least one flip-flop receiving an output from said OR gate, means for selecting an OR gate output or a flip-flop output for transmission to an output pin, and means for communicating with said selecting means for driving said output pin, the improvement in combination therewith comprising,
    means for detecting changes in logic states of inputs to said AND gates, said detecting means generating a detection signal in response thereto, means responsive to said detection signal for generating an AND array enable signal and an OR array enable signal, said AND gates and OR gates being connected to a power supply via associated pull-up elements, said pull-up elements being activated by said enable signals, whereby said AND gates and said OR gates are in an enabled state for predetermined time periods after said changes in logic states are detected and in a disabled state during all other time periods, and means for temporarily storing at least one output signal from each OR gate while said AND gates and said OR gates are disabled.

17. The improved logic array device of claim 16 wherein said means for generating an AND array enable signal and an OR enable signal includes an OR enable generating circuit having signal delaying means for delaying enablement of said OR gates until after said AND gates have produced outputs and also having delay bypass means for causing disablement of said OR gates prior to disablement of said AND gates.

* * * * *

UNITED STATES PATENT AND TRADEMARK OFFICE
CERTIFICATE OF CORRECTION

PATENT NO. : 4,906,870

DATED : March 6, 1990

INVENTOR(S) : Geoffrey S. Gongwer

It is certified that error appears in the above-identified patent and that said Letters Patent is hereby corrected as shown below:

Column 2, line 26, "signal operating circuit" should read
  -- signal generating circuit --.

Column 3, line 46, "Delay circuits 83" should read
  -- Delay circuit 83 --.

Column 5, line 7, "are turn off" should read
  -- are turned off --.

Column 5, line 15, "goes low enabling" should read
  -- goes low, enabling --.

Column 7, line 7, "ouptut" should read -- output --.

Column 8, line 18, "or form an input buffer" should read
  -- or from an input buffer --.

Claim 13, column 12, line 10, "device of claim 13" should read
  -- device of claim 12 --.

Signed and Sealed this

Second Day of April, 1991

*Attest:*

HARRY F. MANBECK, JR.

*Attesting Officer*   *Commissioner of Patents and Trademarks*

REEXAMINATION CERTIFICATE (1890th)
United States Patent [19]
Gongwer

[11] B1 4,906,870
[45] Certificate Issued  Dec. 29, 1992

[54] LOW POWER LOGIC ARRAY DEVICE

[75] Inventor: Geoffrey S. Gongwer, San Jose, Calif.

[73] Assignee: Atmel Corporation, San Jose, Calif.

Reexamination Request:
No. 90/002,555, Feb. 18, 1992

Reexamination Certificate for:
Patent No.: 4,906,870
Issued: Mar. 6, 1990
Appl. No.: 265,830
Filed: Oct. 31, 1988

Certificate of Correction issued May 7, 1990.

[51] Int. Cl.⁵ .............. H03K 19/096; H03K 19/003; H03K 17/687; H03K 3/013
[52] U.S. Cl. .................. 307/465; 307/469; 307/296.3; 364/716; 371/10.1
[58] Field of Search ............... 307/465, 468, 296.3

[56]  References Cited
U.S. PATENT DOCUMENTS

| | | | |
|---|---|---|---|
| 4,831,285 | 5/1989 | Gaiser | 307/465 |
| 4,893,033 | 1/1990 | Itano et al. | 307/465 |
| 4,906,862 | 3/1990 | Itano et al. | 307/296.3 |

FOREIGN PATENT DOCUMENTS

| | | | |
|---|---|---|---|
| 60-21628 | 2/1985 | Japan | 307/465 |

OTHER PUBLICATIONS

Mead & Conway, *Introduction to VLSI Systems*, Addison-Wesley Pub. Co., Reading, Mass., Oct. 1980, pp. 76-79 and 221-228.
Wong, et al., "Novel Circuit Techniques for Zero--Power 25-NS CMOS Erasable Programmable Logic Devices (EPLD's)-IEEE Journal of Solid State Circuits", vol. SC-21 No. 5 Oct. 1986 pp. 766-774.

*Primary Examiner*—D. R. Hudspeth

[57]  ABSTRACT

A logic array device having an imput switch detector circuit for each input signal line leading into an array of logic gates and means for enabling the array whenever and only when a change in logic level of at least one input signal is detected. An AND array has a pull-up element connected to the device's power supply, which element is turned on by an AND array enable signal generated by a circuit responsive to switch detection. Likewise, OR gates or NOR gate/invertor combinations have a pull-down or pull-up element which is turned on by an OR array enable signal. The AND array is enabled first, followed by the OR gate or gates. The OR gate or gates is disabled first before the AND gate is disabled. Disablement of the gates when no input level switch is occurring reduces power consumption without effecting device speed, while the order of enablement and disablement prevents glitches or loss of the output signal level during enablement and disablement.

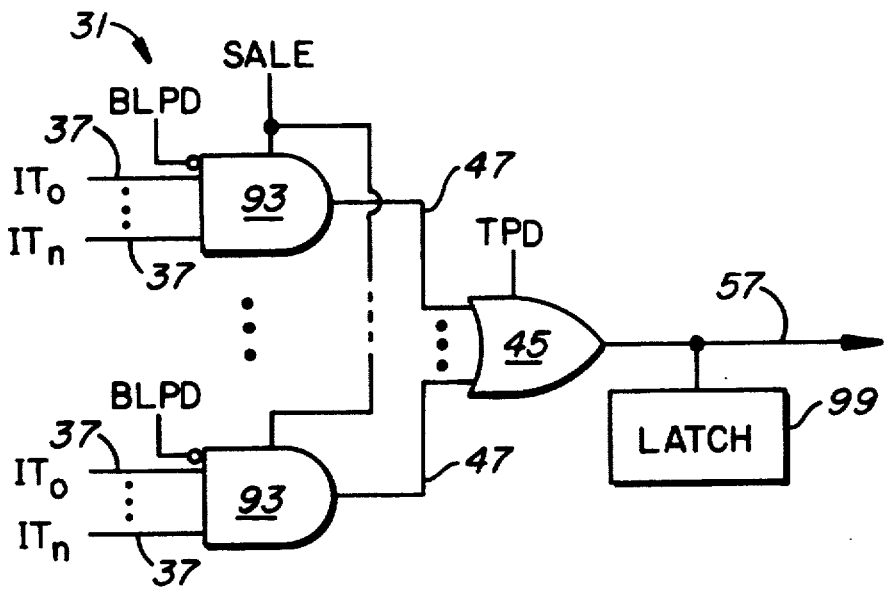

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1 and 16 are determined to be patentable as amended.

Claims 2-15 and 17, dependent on an amended claim, are determined to be patentable.

1. A logic array device comprising,
at least one array of logic gates, each array producing at least one output signal corresponding to logic states of said gates,
means for detecting changes in logic levels of inputs to said gates, said detecting means generating at least one detection signal in response to a change in said logic level of at least one input to said gates,
means receiving said detection signal for enabling said logic gates for a time period after said changes are detected, said logic gates of said array being in a disabled, reduced power consuming state outside of said time period, and
means for temporarily storing at least one *combinatorial* output signal from each array while said logic gates of said array are disabled.

16. In a logic array device of the type having at least one array of AND gates, at least one OR gate having a plurality of inputs connected to outputs of said AND dates, at least one flip-flop receiving an output from said OR gate, means for selecting an OR gate *combinatorial* output or a flip-flop *registered* output for transmission to an output pin, and means for communicating with said selecting means for driving said output pin, the improvement in combination therewith comprising,
means for detecting changes in logic states of inputs to said AND gates, said detecting means generating a detection signal in response thereto,
means responsive to said detection signal for generating an AND array enable signal and an OR array enable signal, said AND gates and OR gates being connected to a power supply via associated pull-up elements, said pull-up elements being activated by said enable signals, whereby said AND gates and said OR gates are in an enabled state for predetermined time periods after said changes in logic states are detected and in a disabled state during all other times periods, and
means for temporarily storing at least one output signal from each OR gate while said AND gates and said OR gates are disabled, *said at least one temporarily stored output signal being a combinatorial output from each OR gate.*

* * * * *